AUTOMATIC GAIN CONTROL CIRCUITS

Filed April 14, 1958 2 Sheets-Sheet 1

INVENTOR.
JOHN W. BECK
BY Robert H. Fraser
ATTORNEY

AUTOMATIC GAIN CONTROL CIRCUITS

Filed April 14, 1958 2 Sheets-Sheet 2

INVENTOR.
JOHN W. BECK

BY Robert H. Frasaw

ATTORNEY

United States Patent Office 3,032,719

Patented May 1, 1962

3,032,719

AUTOMATIC GAIN CONTROL CIRCUITS

John W. Beck, San Jose, Calif., assignor to International Business Machines Corporation, New York, N.Y., a corporation of New York Filed Apr. 14, 1958, Ser. No. 728,127
9 Claims. (Cl. 330—29)

Figure 1:
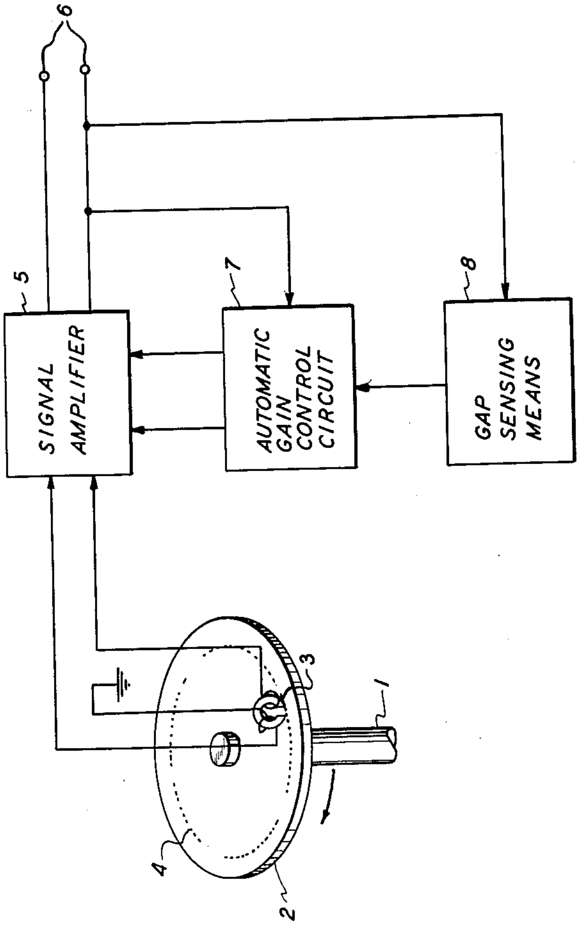

This invention relates to amplifying systems including automatic gain controls, and more particularly to an automatic gain control circuit for controlling the gain of an amplifier having a selectable rate of response to fluctuations in signal amplitude.

In the field of data processing and digital computers, it is well known to employ a device which stores information in the form of changes in the polarity of magnetization of a magnetizable recording surface. For example, a disk or a drum having a surface coating of a magnetizable material may be passed beneath a transducer which is adapted either to magnetize the moving surface in accordance with an applied electrical signal or derive from the surface previously recorded signals. Generally, in digital computers, the signals derived comprise a train of electrical pulses of constant amplitude which may occur in groups separated by time intervals or gaps in which no signals are present.

Due to the difficulty in maintaining a uniform spacing between a transducer and a recording surface as well as due to variations in the magnetization characteristics of the surface, an electrical signal train derived from a recording surface may fluctuate in amplitude. Since the variations in amplitude of the electrical pulses in a signal train may upset the operation of the data processing or digital computer system, it is essential that some means be provided for maintaining a constant amplitude of the pulses comprising the derived signal train.

One way in which the electrical pulses of a signal train may be maintained at a substantially constant amplitude is by including an automatic gain control circuit which adjusts the gain of an amplifier to compensate for fluctuations in variation of amplitude of an input signal. Where the electrical pulses of the signal train appear at a relatively fast rate, the automatic gain control circuit must be arranged to have a relatively fast response time so as to compensate for amplitude variations. Such an automatic gain control circuit may include a capacitor which is charged by the output signals from the amplifier and discharged via a fixed resistor, with the gain of the amplifier being altered in accordance with the voltage appearing across the capacitor. The speed of response of the automatic gain control circuit is a function of the time constant of the capacitor and the resistor in the discharge path. Hence, the time constant of the circuit must be relatively short in order to afford a fast automatic gain control operation.

Where an electrical signal train includes a recurrent series of electrical pulses separated by time intervals as described above, a difficulty arises due to the fact that a fast operating automatic gain control circuit tends to elevate the gain of the amplifier during the time intervals between recurrent sets of electrical pulses. The result is that the first few pulses of a group following a time interval may be unduly amplified since in the absence of a signal the automatic gain control circuit functions to increase the gain of the amplifier.

In order to overcome the above described difficulty arising in the reproduction of a signal train including groups of recurrent electrical pulses separated by intervals of time, an automatic gain control circuit must be provided in which the rate of response to a change in amplitude of the output signal is switched from a relatively fast rate of response to a relatively slow rate of response during the intervals between groups of recurrent pulses.

Accordingly, it is an object of the present invention to provide an automatic gain control circuit in which the rate of response to changes in an output signal is switched from a fast rate of response to a slow rate of response during intervals between groups of recurrent pulses in a signal train.

It is another object of the present invention to provide an automatic gain control circuit in which the rate of response is determined by the time constant of an integrating circuit in which two separate discharge paths are provided for a capacitor with one of the discharge paths being capable of being disabled to reduce the rate of response of the automatic gain control circuit.

It is yet another object of the invention to provide an automatic gain control circuit in which the gain of an amplifier is controlled through the selective switching of a plurality of zener diodes having graduated values of back voltage.

It is still another object of the invention to provide an automatic gain control circuit having a push-pull output for controlling the gain of both channels of a push-pull amplifier.

Briefly, in accordance with the invention, an automatic gain control circuit is provided for use in conjunction with an amplifier in which a capacitor is charged by a signal derived from the amplifier, a first continuous discharge path is provided for the capacitor, a second discharge path is capable of being selectively connected to the capacitor for changing the rate of response of the automatic gain control circuit, and a voltage derived from the capacitor is employed to switch into operation a plurality of zener diodes having graduated back voltages to control the gain of the amplifier.

Figure 2:
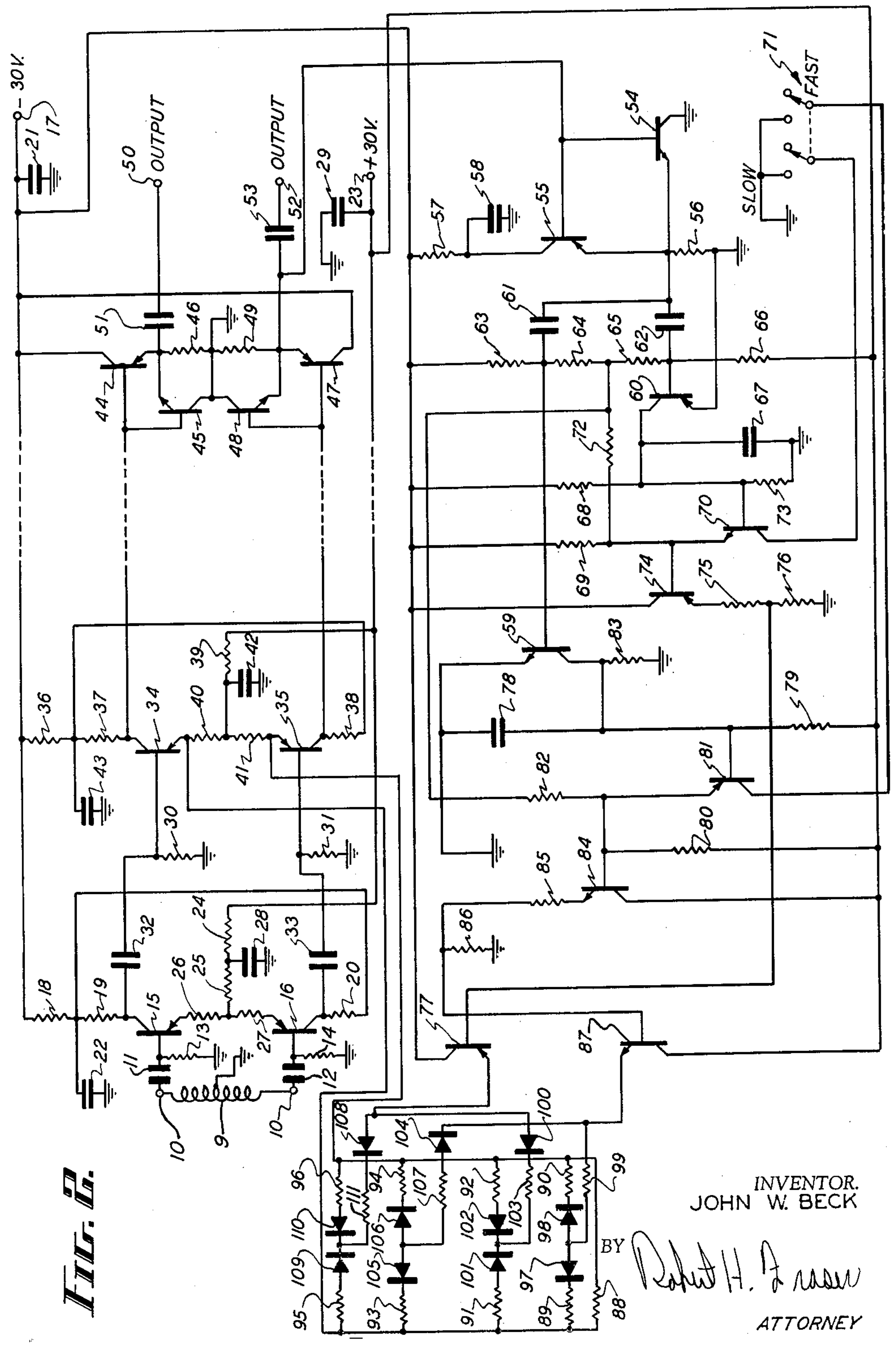

A better understanding of the invention may be had from a reading of the following detailed description and an inspection of the drawings, in which:

FIG. 1 is a diagrammatic illustration of a system for deriving signals from a magnetic recording in accordance with the invention; and FIG. 2 is a schematic circuit diagram of an amplifier including an automatic gain control circuit in accordance with the inventon which may be employed in the system of FIG. 1.

In FIG. 1, an information storage system is illustrated diagrammatically in which a rotatable shaft 1 supports a disk 2 having a magnetizable surface for storing information. Associated with the disk 2 is a transducer 3 which is capable of sensing information represented by changes in magnetization of the disk 2 along a track 4. The information recorded along the track 4 may be arranged in groups separated by gaps in which no information is recorded, so that when the shaft 1 is rotated, an electrical signal train appears across the transducer 3 comprising a plurality of groups of recurrent electrical pulses separated by intervals of time.

By means of a center tap on the transducer 3, a push-pull output may be applied to a signal amplifier 5 which includes a separate channel for handling each of the out-of-phase signals supplied by the transducer 3.

Since digital information is generally represented by the presence, absence or polarity of an electrical pulse rather than the amplitude of an electrical pulse, it is desirable that a signal train be provided at the output terminals 6 in which every electrical pulse is of a constant amplitude. In order to achieve a signal train at the terminals 6 having a constant amplitude where the electrical pulses applied to the signal amplifier 5 vary in amplitude, a portion of the output signal may be applied to an automatic gain control circuit 7 to alter the gain of the signal amplifier 5 in a direction and to an extent which compensates for variations in amplitude of the input signals so that a signal train is provided at the output terminals 6 comprising electrical pulses of substantially constant amplitude.

It will be appreciated that in order to adjust for variations in amplitude of the pulses appearing in any given group of pulses derived from the disk 2, the automatic gain control circuit should have a relatively fast response. On the other hand, during the intervals occurring between groups of pulses appearing on the track 4, it is desirable that the automatic gain control circuit 7 have a relatively slow response so as not to alter the gain of the signal amplifier 5 in a direction which would cause the first one or more electrical pulses of a succeeding group to be unduly amplified.

Accordingly, the apparatus of FIG. 1 includes a gap sensing means 8 which is adapted to identify the intervals between successive groups of electrical pulses. The gap sensing means 8 is connected to the automatic gain control circuit 7 to retard the operation of the automatic gain control circuit during the gaps between successive groups of recurrent pulses. The result is that the automatic gain control circuit 7 has a relatively fast response to variations in amplitude of the output signal during periods in which recurrent electrical pulses are applied to the signal amplifier 5 and a relatively slow response to variations in amplitude during intervals between successive recurrent groups of pulses.

FIG. 2 is a schematic circuit diagram of an amplifier and automatic gain control circuit in accordance with the invention for use in the system of FIG. 1. The amplifier of FIG. 2 includes a pair of input terminals 10 across which there is connected the coil 9 of a transducer such as that illustrated in FIG. 1. The coil 9 is center-tapped to ground so that equal and opposite pulses appear at the terminals 10 in response to a change in magnetization on the surface of a record passing adjacent the transducer. The pulses appearing at the terminals 10 are passed by the coupling capacitors 11 and 12 and appear across the resistors 13 and 14. A first push-pull amplification stage including the transistors 15 and 16 receives the pulses appearing across the resistors 13 and 14.

In accordance with conventional practice, in the schematic circuit diagram of FIG. 2 where the emitter electrode of the transistor is indicated by an arrow pointing inwardly, the transistor is a P-N-P type. On the other hand, where the emitter is represented by an arrow pointing outwardly from the transistor, the transistor is an N-P-N type.

The transistors 15 and 16 receive a negative collector potential from a negative voltage supply terminal 17 via a common resistor 18 and the individual resistors 19 and 20. Unwanted alternating current components may be filtered from the negative supply voltage by means of a capacitor 21. A decoupling capacitor 22 returns the junction between the common resistor 18 and the individual resistors 19 and 20 to ground reference potential for alternating current.

In a similar fashion, the transistors 15 and 16 each receive a positive emitter potential from a positive voltage supply terminal 23 via the resistors 24, 25, 26 and 27. The junction between the resistors 24 and 25 is returned to ground reference potential for alternating current via a decoupling capacitor 28 and the positive voltage supply terminal 23 may be connected to a filter capacitor 29.

In operation, the transistors 15 and 16 function to supply amplified pulses across the resistors 19 and 20 corresponding to pulses from the terminals 10 which are passed to a pair of resistors 30 and 31 in a succeeding push-pull amplification stage via the coupling capacitors 32 and 33. In a particular embodiment of the amplifier of FIG. 2, the amplified signals passed by the coupling capacitors 32 and 33 may be amplified in a number of successive push-pull amplification stages substantially similar to the first amplification stage. However, in order to simplify the drawing, only the first two amplification stages and the output stage are illustrated. Accordingly, in place of the dashed lines connecting the second amplification stage to the output stage, any desired number of additional amplification stages may be included.

The second amplification stage includes a pair of transistors 34 and 35 which are connected in a circuit configuration in which they derived positive and negative biasing potentials from the terminals 17 and 23 via the resistors 36, 37, 38, 39, 40 and 41 with a decoupling capacitor 42 returning the emitter circuit to ground reference potential for alternating current, and a decoupling capacitor 43 returning the collector circuit to ground reference potential for alternating current.

The overall gain of the amplifier of FIG. 2 is controlled by varying the value of the resistances in the emitter circuits of the transistors 34 and 35. The variation in resistances is accomplished by means of an automatic gain control circuit which parallels selected values of resistors with the resistors 40 and 41. A detailed description of the operation of the automatic gain control circuit is set forth below.

After passing through successive intermediate stages, the amplified signals may be applied to an output stage which includes in each channel a pair of transistors connected in complementary symmetry. Thus, the amplified signal in the upper channel is applied to a P-N-P transistor 44 and an N-P-N transistor 45. The transistors 44 and 45 share a common emitter resistor 46 and are each connected in a common collector configuration. In a similar fashion, the amplified signal in the lower channel is applied to a pair of transistors 47 and 48, also connected in complementary symmetry sharing a common emitter resistor 49. Accordingly, the complementary symmetry output circuits provide an amplified signal train at an output terminal 50 via a coupling capacitor 51 and another amplified signal train at a second output terminal 52 via a coupling capacitor 53.

In the circuit of FIG. 2, the output signal appearing across the emitter resistor 49 is applied to an automatic gain control circuit including an amplification stage comprising a pair of transistors 54 and 55 connected in complementary symmetry sharing a common emitter resistor 56. Operating potential is applied to the collector of the transistor 55 from the negative voltage supply terminal 17 via a resistor 57. The collector of the transistor 55 is returned to ground for alternating current via a capacitor 58. The automatic gain control circuit of FIG. 2 includes two separate channels, each of which includes a like integrating circuit for deriving a control voltage for use in adjusting the gain of the amplifier. Accordingly, the amplified signal train appearing across the emitter resistor 56 is passed to the base of a transistor 59 in one channel and the base of a transistor 60 in another channel via the coupling capacitors 61 and 62. A voltage divider comprising the resistors 63, 64, 65 and 66 is connected between the negative voltage supply terminal 17 and the positive voltage supply terminal 23 to bias the transistors 59 and 60 in a direction of minimum conductivity.

In the lower channel of the automatic gain control circuit, the transistor 60 is connected across an integrating circuit including capacitor 67. The value of the time constant of the circuit including the integrating capacitor 67 determines the speed of response of the automatic gain control circuit to a variation in amplitude of the pulses appearing in the signal train. Accordingly, there is connected to the capacitor 67 a first continuous circuit path including a resistor 68. A second circuit path which may be selectively enabled to pass current is provided by a resistor 69 and a transistor 70.

When a switching device such as a double pole switch 71 is in the fast response position, the collector of the transistor 70 is floating and the base-emitter junction of the transistor 70 is biased in a forward direction due to the potential appearing at a connection between the resistor 69 and an inverse feedback retsisor 72. Accordingly, the transistor 70 functions in the manner of a forward biased diode so that the second circuit path including the resistor 69 is connected to the capacitor 67. The time constant of the circuit as a whole is thereby lowered so that the voltage appearing across the capacitor 67 fluctuates in accordance with variations in amplitude of the pulses of the signal train and a corresponding voltage appearing across a resistor 73 is applied to the base of an emitter follower transistor 74 via the transistor 70.

By means of a suitable gap sensing circuit for identifying the time intervals appearing between groups of signal information, the switching device 71 may be moved to the slow position in which the collector of the transistor 70 is returned to ground. When the collector of the transistor 70 is returned to ground, the second circuit path including the resistor 69 is disconnected from the capacitor 67 and the value of the time constant of the circuit is raised with a consequent lowering of the speed of response of the automatic gain control circuit.

In a time interval between recurrent groups of pulses, the voltage appearing across the capacitor 67 and the resistor 73 remains substantially constant. Connected to the emitter follower transistor 74 is a voltage divider comprising a pair of resistors 75 and 76 from which is derived an automatic gain control signal for application to the base of an output transistor 77.

The operation of the upper channel of the automatic gain control circuit including the transistor 59 is essentially similar to the operation of the lower channel just described. Accordingly, the transistor 59 determines the state of charge of an integrating capacitor 78 in accordance with the amplitude of the signal train, a first continuous circuit path is connected to the capacitor 78 including a resistor 79 and a second circuit path is connected to the capacitor 78 including a resistor 80 when the collector of a transistor 81 is open-circuited by the switching device 71.

The emitter-base junction of the transistor 81 is biased in a forward direction by the potential appearing between the resistor 80 and an inverse feedback resistor 82 so that the second circuit path including the resistor 80 may be selectively connected or disconnected to the capacitor 78 by grounding or open-circuiting the collector of the transistor 81 by means of the switching device 71. Accordingly, the voltage appearing across a resistor 83 corresponds to the voltage on the capacitor 78 and is passed by the transistor 81 to the base of an emitter follower transistor 84. A voltage divider is connected to the emitter of the transistor 84 including a pair of resistors 85 and 86 from which is derived an automatic gain control circuit signal for application to the base of an output transistor 87.

In order to alter the gain of the amplifier in accordance with variations in the automatic gain control signals appearing at the emitter of the output transistors 77 and 87, a special circuit is provided for lowering the emitter circuit resistances in the second amplification stage of the amplifier which includes the transistors 34 and 35. Since the resistors 40 and 41 in the emitter circuits of the second amplification stage are un-bypassed, a substantial amount of degeneration occurs when the emitter circuit resistances are at a relatively high value.

Accordingly, in a condition of minimum gain, the resistors 40 and 41 are paralleled by a single fixed resistor 88. However, as the signal applied to the input terminals 10 tends to decrease in amplitude, the gain of the second amplification stage is increased by decreasing the emitter circuit resistances. In the special circuit illustrated in FIG. 2, four pairs of resistors 89—90, 91—92, 93—94 and 95—96 are arranged to be connected in parallel with the resistors 40 and 41 to maintain a substantially constant amplitude of signal train pulses at the output terminals 50 and 52. The pairs of resistors in the special circuit are sequentially connected in parallel with the resistors 40 and 41 in response to the automatic gain control signals appearing at the emitters of the output transistors 77 and 87.

Assuming that the amplitude of the signals applied to the input terminals 10 passes from a relatively high amplitude at which minimum gain of the second amplification stage is required to a relatively low amplitude at which maximum gain of the second amplification stage is desired, the sequence of operations in the special circuit in response to the automatic gain control signals from the transistors 77 and 87 will be described. In a condition of high input signal level and minimum amplifier gain, only the fixed resistor 88 is paralleled with the emitter circuit resistors 40 and 41. However, as the input signal amplitude decreases, a voltage is first applied to a pair of diodes 97 and 98 via a resistor 99 from the lower output transistor 87. When the signal at the emitter of the output transistor 87 rises to a level at which the diodes 97 and 98 are rendered conductive, the resistors 89 and 90 are connected in parallel with the resistors 40 and 41. Assuming a further decrease in input signal amplitude requiring a further increase in gain, a voltage appearing at the emitter of the upper output transistor 77 renders a zener diode 100 conducting, which in turn applies a voltage to the diodes 101 and 102 via a resistor 103 which connects the pair of resistors 91 and 92 in parallel with the emitter circuit resistors 40 and 41.

In a similar fashion, a further decrease in the amplitude of the input signal produces an automatic gain control voltage at the emitter of the lower output transistor 87 which renders a zener diode 104 conducting to apply a voltage to a pair of diodes 105 and 106 via a resistor 107 to connect the pair of resistors 93 and 94 in parallel with the emitter circuit resistors 40 and 41.

Maximum gain of the amplifier is achieved upon a further reduction in the input signal amplitude which produces an automatic gain control signal at the emitter of the upper output transistor 77 to render a zener diode 108 conductive to apply a voltage to a pair of diodes 109 and 110 via resistor 111 to connect the uppermost pair of resistors 95 and 96 in parallel with the resistors 40 and 41.

Although the operation of the circuit has been described for a fluctuation in input signal amplitude from a relatively high value to a relatively low value, it will be appreciated that under normal circumstances the fluctuations in the input signal will cause a sequence of switching of the resistors in the special circuit other than from a condition of minimum amplifier gain to a condition of maximum amplifier gain.

A particular feature of advantage of the automatic gain control circuit and special switching circuit of the invention arises due to the fact that each channel of the automatic gain control circuit includes transistors of opposite conductivity types to those included in the other channel. The result is that the automatic gain control signal appearing at the emitter of the upper output transistor 77 is out-of-phase with respect to the signal appearing at the emitter of the lower output transistor 87. Accordingly, as the switching of the special circuit proceeds, the opposite polarities of the automatic gain control signals to cancel so that a minimum transient switching voltage passes from the special switching circuit to the second amplification stage.

The following list of circuit component values is given by way of example, being indicative only of one workable embodiment.

| | |
|---|---|
| Capacitors **11**, **12**————————microfarads—— | .047 |
| Capacitors **21**, **22**, **28**, **29**, **42**, **43**, **58**——do———— | 8 |
| Capacitors **32**, **33**, **51**, **53**————————microfarad—— | 1 |

| | | |
|---|---|---|
| Capacitors **61, 62** | micromicrofarads | 1,500 |
| Capacitors **67, 78** | microfarad | .02 |
| Resistors **13, 14** | ohms | 510 |
| Resistors **18, 36, 111** | do | 4,300 |
| Resistors **19, 20, 37, 38** | do | 1,800 |
| Resistors **24, 39, 88, 103, 107** | do | 5,100 |
| Resistors **25, 46, 49, 56** | do | 10,000 |
| Resistors **26, 27** | do | 160 |
| Resistors **30, 31, 93, 94** | do | 820 |
| Resistors **40, 41** | do | 22,000 |
| Resistor **57** | do | 2,000 |
| Resistors **63, 66** | do | 20,000 |
| Resistors **64, 65** | do | 3,900 |
| Resistors **68, 79** | do | 360,000 |
| Resistors **69, 80** | do | 36,000 |
| Resistors **72, 82** | do | 75,000 |
| Resistors **73, 83** | do | 750,000 |
| Resistors **75, 85** | do | 4,700 |
| Resistors **76, 86, 99** | do | 7,500 |
| Resistors **89, 90** | do | 6,200 |
| Resistors **91, 92** | do | 2,200 |
| Resistors **95, 96** | do | 330 |
| Transistors **15, 16, 34, 35, 44, 47, 55, 60, 74, 77, 81** | | IBM 01 |
| Transistors **45, 48, 54, 59, 70, 84, 87** | | IBM 51 |
| Zener diode **100**, volts back voltage | | 3.7 |
| Zener diode **104**, volts back voltage | | 4.7 |
| Zener diode **108**, volts back voltage | | 5.7 |

By means of the automatic gain control circuit of the invention, there is provided an improved amplifying system for maintaining the amplitude of groups of electrical pulses separated by time intervals in a signal train at a substantially constant value. The illustrative arrangements of the invention of FIGS. 1 and 2 are given as examples only of one way in which the invention may be used to advantage. Accordingly, the invention should not be limited to the particular structure set forth herein, but should be given the full benefit of any and all equivalent arrangements falling within the scope of the annexed claims.

What is claimed is:

1. An automatic gain control circuit which is capable of being switched from one rate of response to variations in amplitude of a signal train to another rate of response to variations in amplitude of a signal train including the combination of a capacitor, means establishing a level of charge on the capacitor corresponding to variations in signal amplitude, a first circuit path connected to the capacitor having an impedance which when taken with the capacitor provides a time constant of a first given value, a second circuit path connected to the capacitor in parallel with the first circuit path and having an impedance which when taken with the capacitor and the first circuit path provides a time constant of a second given value, said second circuit path including a transistor junction, means for biasing the transistor junction in a forward direction, and means applying a potential to the transistor to disconnect the second circuit path from the capacitor to switch the automatic gain control circuit from one rate of response to another rate of response.

2. An automatic gain control circuit for use in connection with an amplifier for amplifying a signal train comprising a plurality of grouped pulses separated by gaps including the combination of a capacitor, means controlling the charging of the capacitor in accordance with the amplitude of pulses derived from the amplifier, a first continuous discharge path for the capacitor having an impedance which when taken with the capacitor provides a time constant of a first given value, a second discharge path connected to the capacitor in parallel with the first discharge path and having an impedance which when taken with the capacitor and the first discharge path provides a time constant of a second given value, said second discharge path including a switching element, said switching element comprising a transistor having at least three electrodes two of which are connected serially in the second discharge path, means for selectively connecting a third electrode of the transistor to a reference potential in response to gaps between groups of pulses to alter the time constant of the automatic gain control circuit from said second given value to said first given value, and means for deriving an automatic gain control voltage from the capacitor.

3. A selectable time constant automatic gain control circuit including the combination of a capacitor, means responsive to the amplitude of applied signals for controlling the state of charge of said capacitor, a semi-conductor device having a base, a collector and an emitter, said base being connected to one side of said capacitor, a first circuit path connected to the capacitor having an impedance which when taken with the capacitor provides a time constant of a first given value, a second circuit path including said emitter and base having an impedance which when taken with the capacitor and the first circuit path provides a time constant of a second given value, means for biasing the emitter with respect to the base in a forward direction whereby the second circuit path is enabled to pass current when the collector is open-circuited, and means applying a reference potential to the collector for disconnecting the second circuit path to lower the rate of response of the automatic gain control circuit to variations in amplitude of applied signals.

4. An automatic gain control circuit including the combination of an amplifier, a capacitor, means applying a signal derived from the amplifier to the capacitor, a first circuit path including a first impedance connected to the capacitor to form a network having a given time constant, a transistor having a base, a collector and an emitter, said base being connected to said capacitor, a second circuit path connected in parallel with the first circuit path including a second impedance connected serially with the emitter, means adjusting the potential of the transistor collector whereby said second circuit path may be selectively connected to the capacitor to lower the time constant of the network, and means adjusting the gain of the amplifier in accordance with the voltage appearing across the capacitor whereby the rate of response to variations in the signal applied to the capacitor is adjusted in accordance with the potential applied to the transistor collector.

5. An amplifying system including an automatic gain control for amplifying groups of electrical pulses separated by time intervals including the combination of an amplifier for receiving an electrical signal train including said groups of pulses separated by time intervals, a capacitor, means for charging the capacitor in accordance with the amp'itude of electrical pulses derived from the amplifier, a first continuous discharge path for the capacitor including a fixed impedance, a second intermittent discharge path for the capacitor including a fixed impedance and the emitter-base junction of a transistor connected serially, said transistor having a collector-base junction, means apulying a reference voltage to the collector-base junction of the transistor to raise and lower the impedance presented to the flow of current to the capacitor through the emitter-base junction of the transistor, and means applying a signal to the amplifier corresponding to the magnitude of the voltage appearing across the capacitor for adjusting the gain of the amplifier.

6. An automatic gain control circuit which is capable of being switched from one rate of response to variations in amplitude of a signal train to another rate of response to variations in amplitude of a signal train including the combination of a capacitor, means establishing a level of charge on the capacitor corresponding to variations in signal amplitude, a first circuit path connected to the capacitor, a second circuit path connected to the capacitor, said second circuit path including a transistor junction, means for biasing the transistor junction in a forward direction, means applying a potential to the transistor to disconnect the second circuit path from the capacitor to switch the automatic gain control circuit from one rate of response to another rate of response, a plurality of zener diodes each having a different back voltage, means applying an automatic gain control signal derived from the capacitor to the zener diodes whereby said zener diodes are sequentially rendered conducting in accordance with increases in the automatic gain control signal, and means connected between the zener diodes and the amplifier for modifying the gain of the amplifier in response to current flow through the zener diodes whereby the gain of the amplifier is adjusted to compensate for variations in amplitude of an input signal.

7. An automatic gain control circuit which is capable of being switched from one rate of response to variations in amplitude of a signal train to another rate of response to variations in amplitude of a signal train including the combination of a pair of channels each of which includes a capacitor, means controlling the charging of the capacitor in each channel in accordance with variations in signal amplitude, each of said capacitors being connected in a network having a predetermined time constant including a transistor junction for selectively passing current to lower the time constant of the network, a separate output circuit for each channel in which an automatic gain control signal appears which is out-of-phase with respect to an automatic gain control signal appearing in the other channel, a plurality of zener diodes each having a different back voltage, means applying automatic gain control signals from the output circuits to the zener diodes whereby said zener diodes are sequentially rendered conducting with increases in the automatic gain control signals, and means connected to the zener diodes for modifying the gain of an amplifier in response to current flow through the zener diodes whereby the out-of-phase automatic gain control signals are substantially cancelled and the gain of the amplifier is adjusted to compensate for variations in amplitude of an input signal.

8. An automatic gain control circuit which is capable of being switched from one rate of response to variations in amplitude of the signal train to another rate of response to variations in amplitude of a signal train including the combination of a pair of channels each of which includes a capacitor, means controlling the charging of the capacitor in each channel in accordance with variations in signal amplitude, each of said capacitors being connected in a network having a predetermined time constant, a separate circuit path including a transistor junction connected across each capacitor to provide an auxiliary discharge path for lowering the time constant of the networks, a separate output circuit for each channel in which an automatic gain control signal appears which is out of phase with respect to an automatic gain control signal appearing in the other channel, and means applying signals derived from both of said output circuits to an amplifier whereby the out of phase automatic gain control signals are substantially cancelled and the gain of the amplifier is adjusted to compensate for variations in the amplitude of an input signal.

9. An amplifying system for amplifying groups of electrical pulses separated by time intervals including the combination of an amplifier for receiving an electrical signal train including said groups of pulses separated by time intervals, a capacitor, means for applying output signals from the amplifier to the capacitor which tend to establish a level of charge on the capacitor corresponding to the amplitude of the electrical pulses, a first continuous discharge path including a fixed impedance connected across the capacitor, a second intermittent discharge path connected in parallel with the first discharge path including a fixed impedance which when taken in conjunction with the capacitor and the fixed impedance of the first discharge path provides a time constant less than the time constant provided by the first discharge path and capacitor alone, said second discharge path including the emitter-base junction of a transistor, said transistor having a collector-base junction, means for sensing the periods in the electrical signal train between said groups of pulses, means for selectively applying a reference voltage to the collector-base junction of the transistor in response to time intervals between said groups of pulses for selectively impeding the flow of current through the second discharge path to raise the time constant of the circuit, and means applying a signal to the amplifier corresponding to the magnitude of the voltage appearing across the capacitior for adjusting the gain of the amplifier whereby the automatic gain control possesses a first given rate of response to changes in amplitude of electrical pulses within each group of pulses and a second lower rate of response during the time intervals between groups of pulses.

References Cited in the file of this patent

UNITED STATES PATENTS

| | | |
|---|---|---|
| 2,212,337 | Brewer | Aug. 20, 1940 |
| 2,346,020 | Gillespie | Apr. 4, 1944 |
| 2,544,340 | Maxwell | Mar. 6, 1951 |
| 2,581,124 | Moe | Jan. 1, 1952 |
| 2,673,899 | Montgomery | Mar. 30, 1954 |
| 2,697,201 | Harder | Dec. 14, 1954 |
| 2,858,424 | Stern | Oct. 28, 1958 |
| 2,860,196 | Schultz | Nov. 11, 1958 |
| 2,891,145 | Bradmiller | June 16, 1959 |

UNITED STATES PATENT OFFICE
CERTIFICATE OF CORRECTION

Patent No. 3,032,719 May 1, 1962

John W. Beck

It is hereby certified that error appears in the above numbered patent requiring correction and that the said Letters Patent should read as corrected below.

Column 5, line 3, for "retsisor" read -- resistor --; column 6, line 67, for "signals to cancel" read -- signals tend to cancel --; column 8, lines 57 and 58, for "apulying" read -- applying --.

Signed and sealed this 28th day of August 1962.

(SEAL)
Attest:

ESTON G. JOHNSON
Attesting Officer

DAVID L. LADD
Commissioner of Patents